United States Patent
Yasuda

(10) Patent No.: US 6,759,667 B2
(45) Date of Patent: Jul. 6, 2004

(54) PHOTOCOUPLING DEVICE AND METHOD OF MANUFACTURING THE SAME

(75) Inventor: Yoshiki Yasuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/837,174

(22) Filed: Apr. 19, 2001

(65) Prior Publication Data

US 2001/0045531 A1 Nov. 29, 2001

(30) Foreign Application Priority Data

May 11, 2000 (JP) ................................ P2000-138802

(51) Int. Cl.$^7$ .............................................. G02B 27/00
(52) U.S. Cl. .................................... 250/551; 257/82
(58) Field of Search ............................... 250/551, 552, 250/239; 257/80–84, 666, 671, 676; 327/514

(56) References Cited

U.S. PATENT DOCUMENTS

| | | | | |
|---|---|---|---|---|
| 4,794,431 A | * | 12/1988 | Park ............................ | 257/82 |
| 5,285,076 A | * | 2/1994 | Kusuda et al. ............... | 250/551 |
| 5,489,800 A | * | 2/1996 | Brown et al. ................ | 257/666 |
| 5,753,929 A | * | 5/1998 | Bliss ........................... | 250/551 |
| 6,080,602 A | * | 6/2000 | Tani et al. .................... | 438/114 |
| 6,225,686 B1 | * | 5/2001 | Matsuura ..................... | 257/668 |

FOREIGN PATENT DOCUMENTS

| | | | | |
|---|---|---|---|---|
| JP | 358168284 A | * | 10/1983 | ........... H01L/31/12 |
| JP | 401261875 A | * | 10/1989 | ........... H01L/31/12 |
| JP | 402168678 A | * | 6/1990 | ........... H01L/31/12 |
| JP | 54525 | | 1/1993 | |
| JP | 9199756 | | 7/1997 | |
| JP | 2000223738 A | * | 8/2000 | ........... H01L/31/12 |

* cited by examiner

Primary Examiner—Thanh X. Luu
Assistant Examiner—Seung C Sohn
(74) Attorney, Agent, or Firm—Birch, Stewart, Kolasch & Birch, LLP

(57) ABSTRACT

An object of the present invention is to provide a photocoupling device which can supply sufficient light to a light receiving element by increasing brightness on the input section side at a low input current, and provide a method of manufacturing, with which such a photocoupling device can be assembled without adding an extra process. A photocoupling device of the invention includes an input section having two light emitting elements and lead terminals for supplying a drive current to the light emitting elements, and an output section having a light receiving element opposed to light emitting faces of the light emitting elements and lead terminals for supplying a drive current to the light receiving element, wherein the two light emitting elements are connected in series.

11 Claims, 9 Drawing Sheets

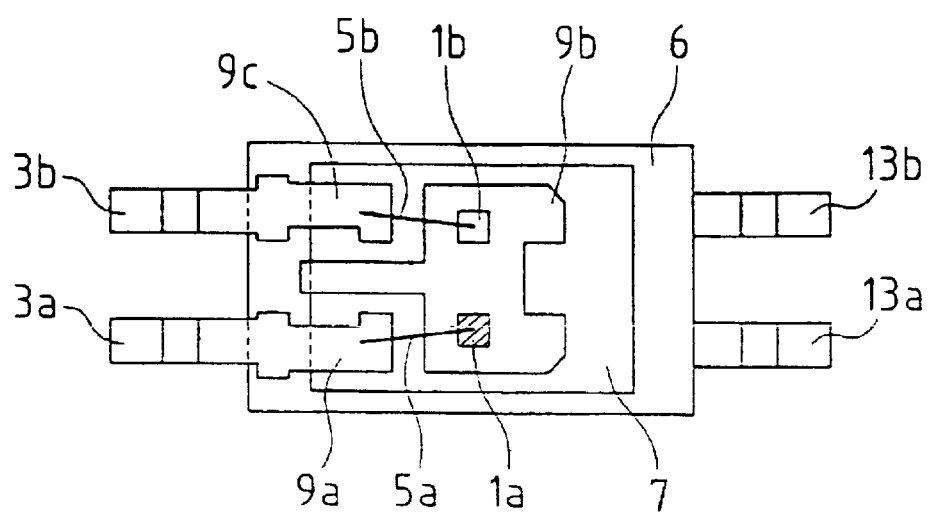

PHOTOCOUPLING DEVICE AND METHOD OF MANUFACTURING THE SAME

BACKGROUND OF THE INVENTION

1. Field of the Invention

The present invention relates to a photocoupling device which comprises an input section having a plurality of light emitting elements and lead terminals for supplying a drive current to these light emitting elements and an output section having a light receiving element opposed to light emitting faces of the light emitting elements and lead terminals for supplying a drive current to the light receiving element, and relates to a method of manufacturing the same.

2. Description of the Related Art

In recent years, it has become important to make equipment energy-saving. With regard to photocoupling devices, a photocoupling device of low input current driving type which can be directly driven by a microcomputer is expected to be mainstream as a photocoupling device from now. For example, in the case where it becomes possible to directly drive a photocoupling device by a microcomputer, the need for a transistor of a drive stage is eliminated. Especially, a plurality of photocoupling devices are needed in an interface section of FA (factory automation) equipment since a plurality of signals are inputted and outputted therein. Therefore, by using a low-input-driving photocoupler, effects of energy saving are increased. Moreover, it is also possible to downsize a current limiting resistor of a light emitting element, so that costs can be reduced.

Consequently, as equipment with a microcomputer becomes widespread, such equipment has been advanced, and a market of photocoupling devices has expanded. Therefore, a demand of developing a photocoupling device of low input current driving type which meets an energy-saving design has grown.

For example, in a microcomputer drive circuit such as a programming console, a conventional general-purpose photocoupling device (for example, a photocoupling device driven at a forward current IF (referred to as IF hereinafter) of 5 mA) is controlled by a microcomputer via a transistor of a drive stage. By using a photocoupling device of low input current driving type (for example, a photocoupling device driven at IF of 0.5 mA) instead of the general-purpose photocoupling device, the circuit can be directly driven by the microcomputer, the current can be reduced to one tenth, and the need of the transistor for the drive stage is eliminated. As a result, costs can be reduced.

In addition, in general household electrical appliances (for example, motor-controlled household electrical appliances such as an air conditioner, a microwave oven and a washer), a photocoupling device is used as an AC (alternating current) line zero cross point detecting device. The device is used for judgment whether frequency is 50 Hz or 60 Hz, detection of an instantaneous shutdown, detection of an AC zero cross point, timer count and so on. A current limiting resistor is inserted to directly drive a light emitting element of a photocoupling device with an AC power source. In this case, in a conventional general-purpose photocoupling device, a voltage of the AC power source is high when an input current is set to IF=5 mArms, so that a current limiting resistor of 20 kΩ/2W (which costs approximately 3 yen) is needed and power consumption reaches 500 mW. In the case where a photocoupling device of low input current driving type is used instead of the general-purpose photocoupling device, an input current can be limited to IF=0.5 mArms, so that it is enough to apply a current limiting resistor of 200 kΩ/0.25W (which is 1 yen or less), and power consumption is lowered to 50 mW. Accordingly, it is possible to achieve both cost reduction and energy saving.

As mentioned above, a variety of advantages can be obtained by making a photocoupling device drive at a low input current.

Next, a structure of a conventional photocoupling device of low input current driving type will be described referring to drawings.

FIG. 10 is a longitudinal sectional view showing an example of a conventional photocoupling device of low input current driving type, FIG. 11 is a transverse sectional view showing an example of the conventional photocoupling device of low input current driving type, and FIG. 12 is an explanatory view showing an example of a connection of the photocoupling device shown in FIGS. 10 and 11. Here, FIG. 11 mainly shows an input section.

The photocoupling device comprises an input section having a light emitting element 101 and an output section having a light receiving element 102 opposed to a light emitting face of the light emitting element 101.

The light emitting element 101 is die-bonded on a header 109a which is connected to one lead terminal 103a for the light emitting element, and further wire-bonded via a wire 105 on a header 109b which is connected to the other lead terminal 103b for the light emitting element. An exposed face of the light emitting element 101 is covered with a protecting resin layer 104 (shown in FIG. 10 only) which is formed by pre-coating with a transparent silicone resin.

On the other hand, the light receiving element 102 is die-bonded on a header 119a which is connected to one lead terminal 113a for the light receiving element, and further wire-bonded via a wire 115 on a header 119b which is connected to the other lead terminal 113b for the light receiving element.

Furthermore, the light emitting element 101 and the light receiving element 102 are covered with a first epoxy resin member 107 which is formed by primary molding with a light-transmitting epoxy resin, in a state where the light emitting face and the light receiving face are opposed to each other. This first epoxy resin member 107 is covered with a second epoxy resin member 106 which is formed by secondary molding with a light proof resin.

This photocoupling device has a 4-pin package (two pins on the input section side and two pins on the output section side).

In this example, a phototransistor is used as the light receiving element 102. As the light emitting element 101, a high-intensity light emitting element of GaAlAs or the like is used so as to drive with a low input current using a single light emitting element. By using the high-intensity light emitting element, not only the amount of light at a low current range is ensured but also sensitivity of the light receiving element is increased, thereby realizing a drive at a low input current. However, a high-intensity light emitting element of GaAlAs or the like is expensive, which costs at least three times more than a general-purpose light emitting element of GaAs or the like.

Next, a photocoupling device equipped with a plurality of elements will be explained referring to drawings.

FIG. 13 is a transverse sectional view showing another example of a structure of a conventional photocoupling device of low input current driving type. Here, FIG. 13 mainly shows an input section.

In general, as the number of elements increases, the number of headers 109c for mounting the elements and headers 109d for wire-bonding increases. In addition, along with the lead terminals 103a, 103b, 113a and 113b, lead terminals 103c, 103d, 113c and 113d are disposed. As compared with a 4-pin photocoupling device as shown in FIGS. 10 and 11, the above photocoupling device has a large package of 6-pin or 8-pin.

This photocoupling device is manufactured, in the same manner as a 4-pin photocoupling device as shown in FIGS. 10 and 11, through the steps of: mounting a light receiving element (not shown), a light emitting element 101 and another element 111 on specified headers 109a and 109c and connecting to lead terminals 103a, 103c and 113a; wire-bonding the light receiving element, the light emitting element 101 and the other element 111 on specified headers 109b, 109d and so on with wires 125a, 125b and so on and connecting to lead terminals 103b, 103d and 113b; and if necessary, pre-coating and so on. After that, lead frames on the input section side and on the output section sided are opposed to each other, and primary molding is performed in a state where the light emitting face of the light emitting element 101 is opposed to the light receiving face of the light receiving element. After this primary molding, burr removal and tie-bar cutting are done at the same time. Next, secondary molding is done, and burr removal and tie-bar cutting are done at the same time as well.

As mentioned above, although it is possible to design an input section of a photocoupling device with one light emitting element by using a high-intensity light emitting element for the purpose of realizing a photocoupling device of low input current driving type, a high-intensity light emitting element is quite expensive, which costs almost three times more than a general-purpose light emitting element.

In the case where a further reduction of drive current is demanded, it will be impossible to ensure sufficient brightness even when a high-intensity light emitting element is used. There is such a problem that it is difficult to increase brightness only by improving a light emitting element itself.

Further, in the case of disposing a plurality of headers inside a photocoupling device and simply increasing the number of light emitting elements, there is such a problem that the number of lead terminals also increases and a size of the package becomes large. Furthermore, although there may be such the case that an unused lead terminal is cut after packaging, this is merely for the purpose of creating an additional space between lead terminals (a lead space). In this case, too, it is impossible to utilize a dimension of a conventional general-purpose 4-pin photocoupling device, thereby creating a problem of making it difficult to design a downsized circuit board.

SUMMARY OF THE INVENTION

The invention is presented for the purpose of solving such problems as mentioned above. An object of the invention is to provide a photocoupling device which can supply sufficient light to a light receiving element by increasing the amount of light on an input section side with a low input current, and provide a method of manufacturing, with which such a photocoupling device can be assembled without adding an extra process.

The invention provides a photocoupling device comprising:

an input section having a plurality of light emitting elements and lead terminals for supplying a drive current to the light emitting elements; and an output section having a light receiving element opposed to light emitting faces of the light emitting elements and lead terminals for supplying a drive current to the light receiving element, wherein the plurality of light emitting elements are connected in series.

According to the invention, it is possible to cause a plurality of light emitting elements to emit light at a low input current, so that it is possible to achieve an increase of light amount and supply sufficient light to a light receiving element.

In the invention, it is preferable that the plurality of light emitting elements are connected in series via a plurality of headers.

According to the invention, it is possible to connect the plurality of light emitting elements in series only by wire-bonding the light emitting elements to headers adjacent thereto.

Further in the invention, it is preferable that at least one of the plurality of headers is provided with two light emitting elements.

Still further in the invention, it is preferable that structures of the two light emitting elements are different from each other.

According to the invention, it is possible to avoid increase of the number of the headers, so that it is possible to realize a further downsized photocoupling device.

Further in the invention, at least one of the plurality of headers may be a dummy header.

According to the invention, it is possible to downsize a package, so that it is possible to realize a further downsized photocoupling device.

Further in the invention, the dummy header may be lead-cut from a lead frame inside or outside a package which covers and protects the light emitting elements and the light receiving element.

According to the invention, especially in the case where the dummy header is lead-cut from a lead frame inside a package, it is possible to prevent a lead-cut portion of the header from protruding beyond the package, so that it is possible to increase an insulation performance between the input section and the output section.

The invention provides a method of manufacturing a photocoupling device comprising the steps of:

forming an input section having a plurality of light emitting elements and lead terminals for supplying a drive current to the light emitting elements and an output section having a light receiving element opposed to light emitting faces of the light emitting elements and lead terminals for supplying a drive current to the light receiving element;

connecting the plurality of light emitting elements in series via a plurality of headers, at least one of the plurality of headers being a dummy header; and tie-bar cutting and lead cutting the dummy header at the same time.

According to the invention, it is possible to lead-cut a dummy header only by partly modifying the shape of a tie-bar cutting die, so that it is possible to assemble without adding an extra process.

Further in the invention, a lead-cut portion of the dummy header may be disposed in the vicinity of a tie-bar cut portion.

According to the invention, it is possible to minimize the need of modification of the shape of a tie-bar cutting die, and to reduce damages to a package during a cutting process.

The invention provides a method of manufacturing a photocoupling device, comprising the steps of:

forming an input section having a plurality of light emitting elements and lead terminals for supplying a drive current to the light emitting elements and an output section having a light receiving element opposed to light emitting faces of the light emitting elements and lead terminals for supplying a drive current to the light receiving element; and connecting the plurality of light emitting elements in series via a plurality of headers, at least one of the plurality of headers being a dummy header, wherein a lead frame is used in which the dummy header is connected to a header of another channel adjacent to the dummy header via a connecting member.

According to the invention, it is possible to lead-cut a dummy header only by partly modifying the shape of a tie-bar cutting die, so that it is possible to assemble without adding an extra process.

BRIEF DESCRIPTION OF THE DRAWINGS

Other and further objects, features, and advantages of the invention will be more explicit from the following detailed description taken with reference to the drawings wherein:

FIG. 7A is a transverse sectional view showing still another embodiment of a photocoupling device of the invention;

DETAILED DESCRIPTION OF THE PREFERRED EMBODIMENTS

Figure 1:
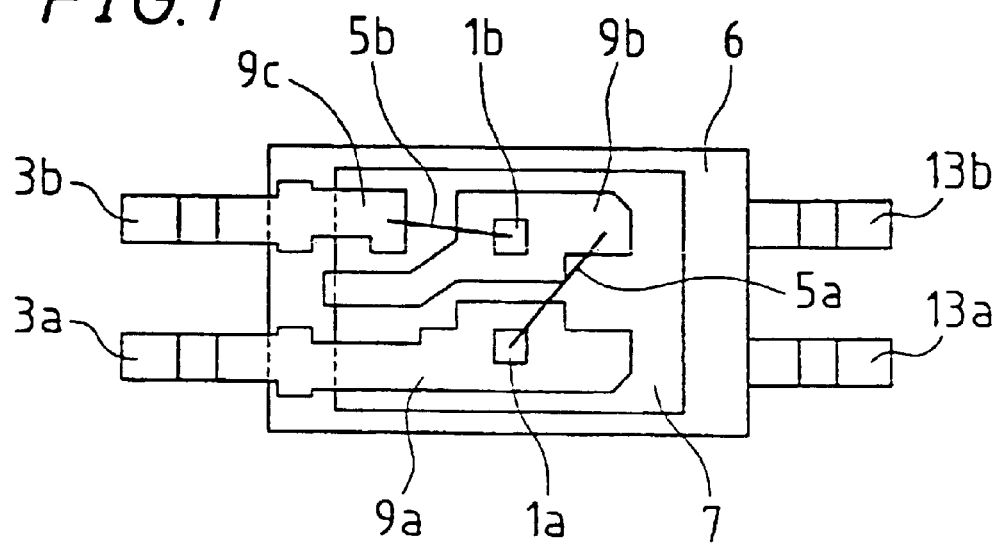
FIG. 1 is a transverse sectional view showing an embodiment of a photocoupling device of the present invention.

Now referring to the drawings, preferred embodiments of the invention are described below.

Next, embodiments of a photocoupling device and a method of manufacturing the same according to the invention will be described.

Embodiment 1

Firstly, a first embodiment of a photocoupling device and a method of manufacturing the same according to the invention will be described.

Figure 2:
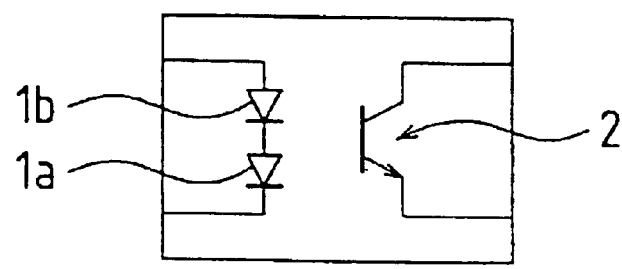
FIG. 2 is an explanatory view showing an example of a connection of the photocoupling device shown in FIG. 1.
Figure 1A:
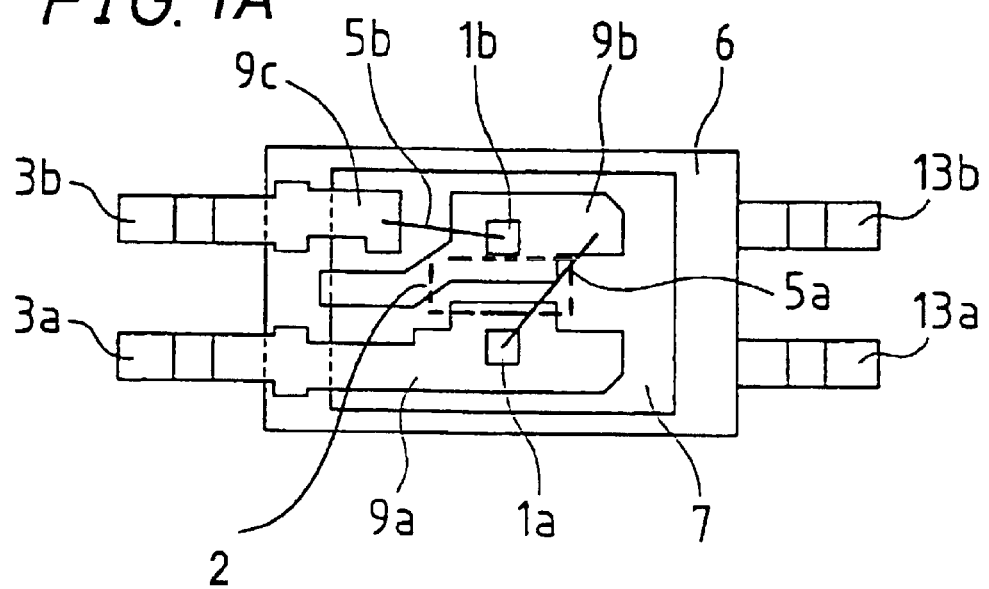
FIG. 1A is a transverse sectional view showing an embodiment of a photocoupling device of the present invention.
Figure 3:
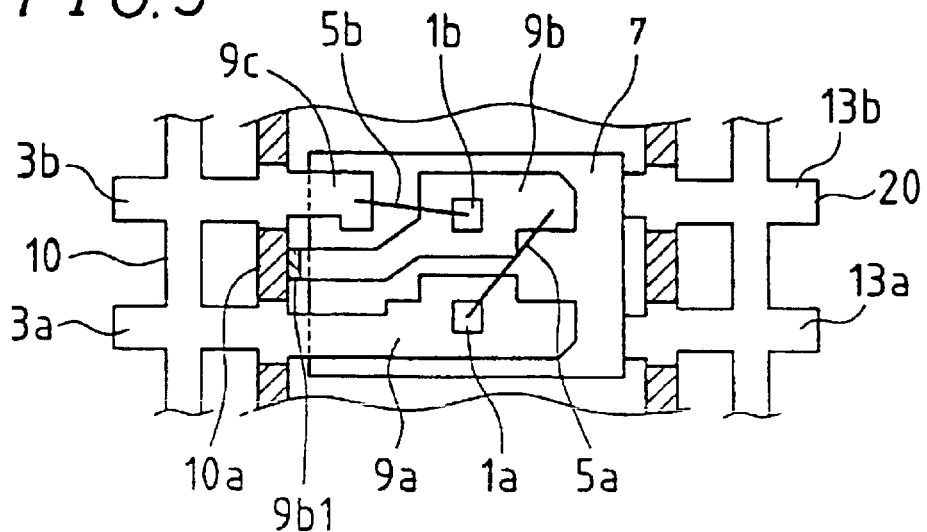
FIG. 3 is a transverse sectional view after secondary molding of the photocoupling device shown in FIG. 1.

FIG. 1 is a transverse sectional view showing an embodiment of a photocoupling device of the invention, FIG. 2 is an explanatory view showing an example of a connection of the photocoupling device shown in FIG. 1, and FIG. 3 is a transverse sectional view after secondary molding of the photocoupling device shown in FIG. 1. In FIGS. 1 and 3, an input section is mainly shown, whereas an output section is not shown.

The photocoupling device comprises an input section having a plurality of (two in this embodiment) light emitting elements 1a and 1b connected in series and lead terminals 3a and 3b for supplying a drive current to the light emitting elements 1a and 1b, and an output section having a light receiving element 2 opposed to light emitting faces of the light emitting elements 1a and 1b and lead terminals 13a and 13b for supplying a drive current to the light receiving element 2.

The light receiving element 2 and the lead terminals 13a and 13b of the output section and the lead terminals 3a and 3b of the input section have the same dimensions and shapes as those of a conventional photocoupling device, and low-price general-purpose light emitting elements can be applied as the light emitting elements.

Further, of the two light emitting elements 1a and 1b, the one light emitting element 1a is mounted on a header 9a for mounting the element which is connected to the one lead terminal 3a, and the other light emitting element 1b is mounted on a dummy header 9b (a header which is not directly connected to a lead terminal). The one light emitting element 1a is wire-bonded on the dummy header 9b via a wire 5a, and the other light emitting element 1b is wire-bonded on a header 9c for wire-bonding which is connected to the other lead terminal 3b via a wire 5b. That is to say, the two light emitting elements 1a and 1b are connected in series between the lead terminals 3a and 3b via the headers 9a, 9b and 9c.

The dummy header 9b is a portion extending from a tie-bar portion (a portion to be removed during the manufacturing process, which is shown diagonally-shaded in FIG. 3) of a lead frame 10 (refer to FIG. 3) which includes the two lead terminals 3a and 3b and the headers 9a and 9c. In the first embodiment, the dummy header 9b extends from a tie-bar portion 10a which is to be removed after primary molding (that is, extending from the tie-bar portion 10a).

When a photocoupling device having such a structure as described above is manufactured, the output section is formed by putting a light receiving element on a lead frame 20 by the same method as in the case of a conventional photocoupling device. The input section is formed through the following steps: die-bonding the light emitting elements 1a and 1b on the headers 9a and 9b with Ag paste or the like; wire-bonding the one light emitting element 1a on the dummy header 9b with the wire 5a, and wire-bonding the other light emitting element 1b on the header 9c for wire-bonding with the wire 5b; and if necessary, pre-coating and so on. After that, the lead frames 10 and 20, on the input section side and the output section side, are opposed to each other, and primary molding is executed with a light-transmitting epoxy resin in a state where the light emitting faces of the light emitting elements 1a and 1b are opposed to the light receiving face of the light receiving element 2, so that a first epoxy resin member 7 for protecting the light emitting elements 1a and 1b and the light receiving element 2 is formed. After this primary molding, at the same time as tie-bar cutting and burr removal are done, an unnecessary portion 9b1 of the dummy header 9b is lead-cut by using a die. Lead-cut to the unnecessary portion 9b1 of the dummy header 9b is performed in the vicinity of the tie-bar portion 10a (a tie-bar cut portion), whereby a holding portion is partly left in order to reduce damage to a package. After that, by the same procedure as in the case of a conventional photocoupling device, secondary molding is done with a lightproof epoxy resin, so that the surface of the first epoxy resin member 7 is covered with a second epoxy resin member 6. Then, burr removal and tie-bar cutting are done.

As described above, by cutting an unnecessary portion of the dummy header 9b at the time of tie-bar cutting and burr removal after primary molding, the dummy header 9b is lead-cut from the lead frame 10 inside a package (the first epoxy resin member 7 and the second epoxy resin member 6) which covers and protects the light emitting elements and the light receiving element.

According to the photocoupling device of the first embodiment, it is possible to cause a plurality of light emitting elements to emit light at a low input current, so that brightness increases and sufficient light can be supplied to a light receiving element.

Although the value of a forward voltage VF becomes large in the case where light emitting elements are connected in series, there is no problem in use for detection of an AC line zero cross point, because the value of a forward voltage is approximately 2.4 V in the case where two light emitting elements are connected in series and approximately 3.6 V in the case where three light emitting elements are connected in series, for example. Although microcomputer-driving may be subject to restriction in some models, there is little difficulty in use.

Further, according to the method of manufacturing a photocoupling device of the first embodiment, it is possible to lead-cut a dummy header only by partly modifying the shape of a general-purpose tie-bar cutting die, without requiring extra processes.

Embodiment 2

Next, a second embodiment of a photocoupling device and a method of manufacturing the same according to the invention will be described.

Figure 4:
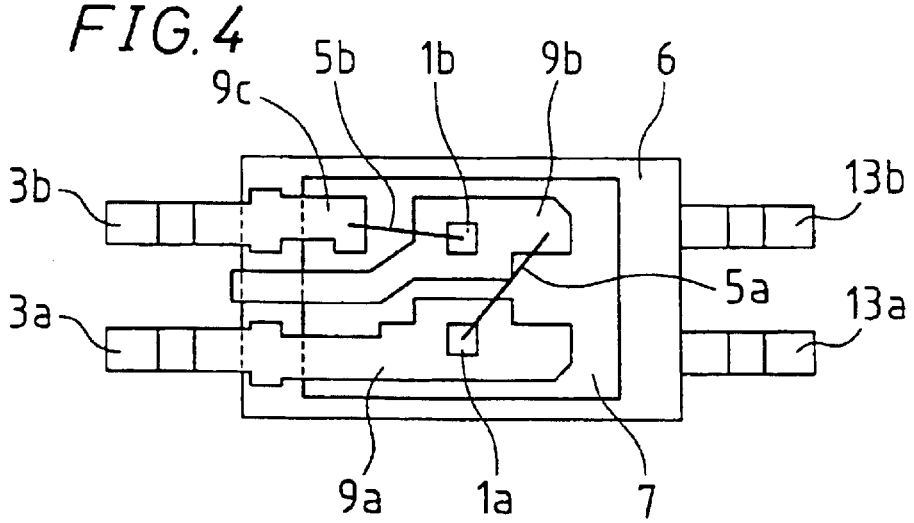
FIG. 4 is a transverse sectional view showing another embodiment of a photocoupling device of the invention.
Figure 5:
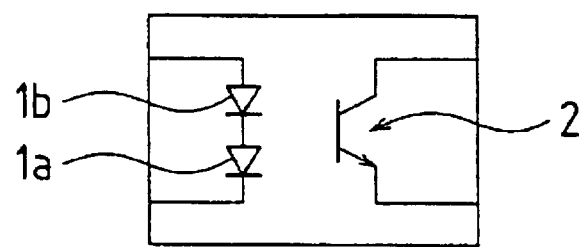
FIG. 5 is an explanatory view showing an example of a connection of the photocoupling device shown in FIG. 4.
Figure 6:
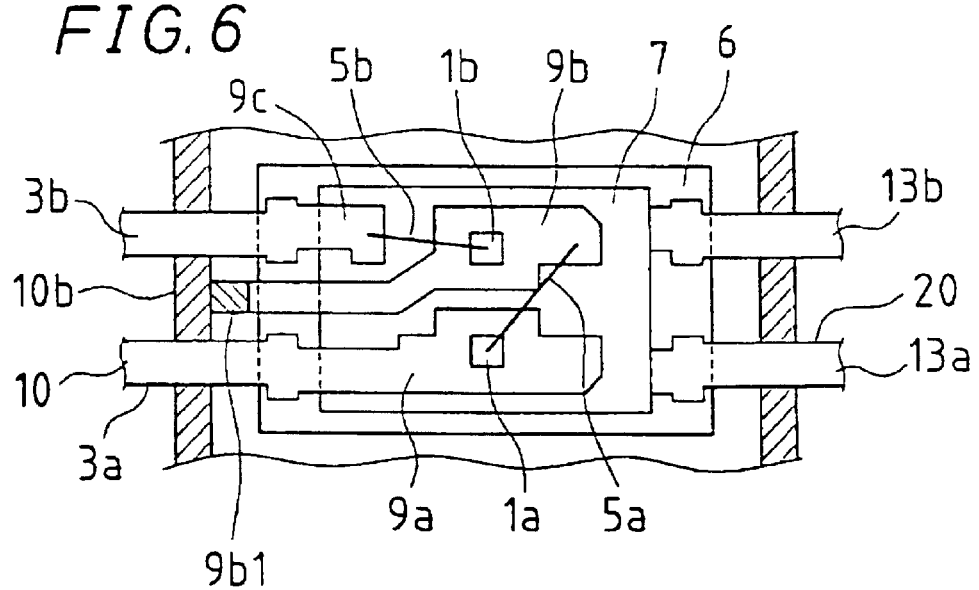
FIG. 6 is a transverse sectional view after secondary molding of the photocoupling device shown in FIG. 4.

FIG. 4 is a transverse sectional view showing another embodiment of a photocoupling device of the invention, FIG. 5 is an explanatory view showing an example of a connection of the photocoupling device shown in FIG. 4, and FIG. 6 is a transverse sectional view after secondary molding of the photocoupling device shown in FIG. 4. In FIGS. 4 and 6, an input section is mainly shown whereas an output section is not shown.

The photocoupling device of the second embodiment differs from the photocoupling device of the first embodiment, in that the dummy header 9b extends from the tie-bar portion 10b of the lead frame 10, which is removed after secondary molding, that is, extending from the tie-bar portion 10b. In FIG. 6, the tie-bar portion 10b to be removed after secondary molding is shown diagonally-shaded.

Further, the method of manufacturing a photocoupling device of the second embodiment differs from that of manufacturing a photocoupling device of the first embodiment, in that a procedure after first molding is the same as in the case of manufacturing a conventional photocoupling device and the unnecessary portion 9b1 of the dummy header 9b is lead-cut by using a die at the same time as tie-bar cutting and burr removal after secondary molding. Also in this case, lead-cut to the unnecessary portion 9b1 of the dummy header 9b is performed in the vicinity of the tie-bar portion 10b (a tie-bar cut portion), whereby a holding portion is partly left in order to limit damage to a package.

As described above, by cutting an unnecessary portion of the dummy header 9b at the time of tie-bar cutting and burr removal after secondary molding, the dummy header is lead-cut from the lead frame outside a package (the first epoxy resin member 7 and the second epoxy resin member 6) which covers and protects the light emitting elements and the light receiving element.

According to the second embodiment, it is possible to obtain the same effects as in the case of the photocoupling device and the method of manufacturing the same in the first embodiment.

Embodiment 3

Next, a third embodiment of a photocoupling device and a method of manufacturing the same according to the invention will be described.

Figure 7:
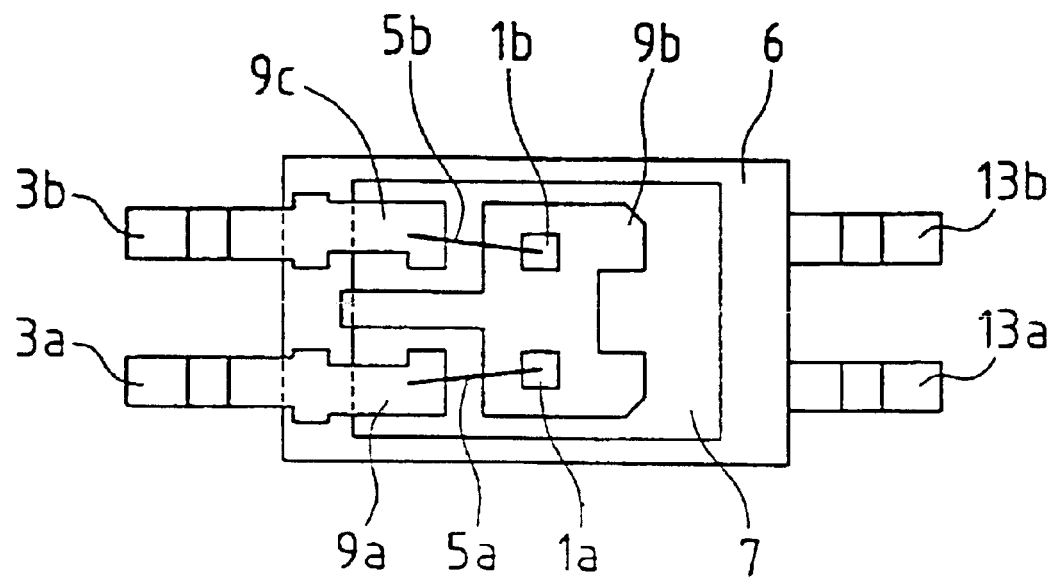
FIG. 7 is a transverse sectional view showing still another embodiment of a photocoupling device of the invention.
Figure 8:
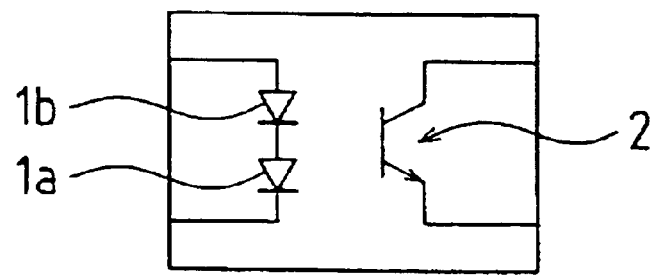
FIG. 8 is an explanatory view showing an example of a connection of the photocoupling device shown in FIG. 7.

FIG. 7 is a transverse sectional view showing still another embodiment of a photocoupling device of the invention, and FIG. 8 is an explanatory view showing an example of a connection of the photocoupling device shown in FIG. 7. In FIG. 7, an input section is mainly shown whereas an output section is not shown.

The photocoupling device of the third embodiment differs from the photocoupling device of the first embodiment, in that two light emitting elements 1a and 1b are mounted on one header 9b.

In order to thus mount two light emitting elements 1a and 1b on one header 9b, two kinds of light emitting elements which have different structures (substrates) are used as the light emitting elements 1a and 1b as shown in FIG. 7A. That is to say, one is a light emitting element in which an n-substrate is used, and the other is a light emitting element in which a p-substrate is used. Here, it is also possible to use light emitting elements having the same structure (for example, the same substrate) by putting one of them upside down as shown in FIG. 7.

In this case, only the headers 9a and 9c for wire-bonding are connected to the lead terminals 3a and 3b on the input section side, and the light emitting elements 1a and 1b are wire-bonded on the headers 9a and 9c, respectively.

When a photocoupling device having such a structure as described above is manufactured, the output section is formed just by putting on the lead frame 20 by the same method as in the case of a conventional photocoupling device. The input section is formed through the following steps: die-bonding the two light emitting elements 1a and 1b on the dummy header 9b with Ag paste or the like; wire-bonding the one light emitting element 1a on the header 9a for wire-bonding with the wire 5a, and wire-bonding the other light emitting element 1b on the header 9c for wire-bonding with the wire 5b; and if necessary, pre-coating and so on. After that, lead frames of the input section side and the output section side are opposed to each other, and primary molding is performed with a light-transmitting epoxy resin in a state where the light emitting faces of the light emitting elements 1a and 1b are opposed to the light receiving face of the light receiving element, and then a first epoxy resin member 7 for protecting the light emitting elements 1a and 1b and the light receiving element 2 is formed. After this primary molding, in the same manner as in the case of the method of manufacturing a photocoupling device in the embodiment 1, an unnecessary portion of the dummy header 9b is lead-cut by using a die at the same time as tie-bar cutting and burr removal. After that, by the same procedure as in the case of a conventional photocoupling device, secondary molding is done with a lightproof epoxy resin, so that the surface of the first epoxy resin member 7 is covered with the second epoxy resin member 6. Then, burr removal and tie-bar cutting are done.

Alternatively, an unnecessary portion of the dummy header 9b may be lead-cut at the same time as tie-bar cutting and burr removal after secondary molding, in the same manner as in the case of the method of manufacturing a photocoupling device in the second embodiment.

According to the third embodiment, it is possible to obtain the same effects as in the case of the photocoupling device and the method of manufacturing the same in the first embodiment.

Embodiment 4

Next, a fourth embodiment of a method of manufacturing a photocoupling device according to the invention will be described.

Figure 9:
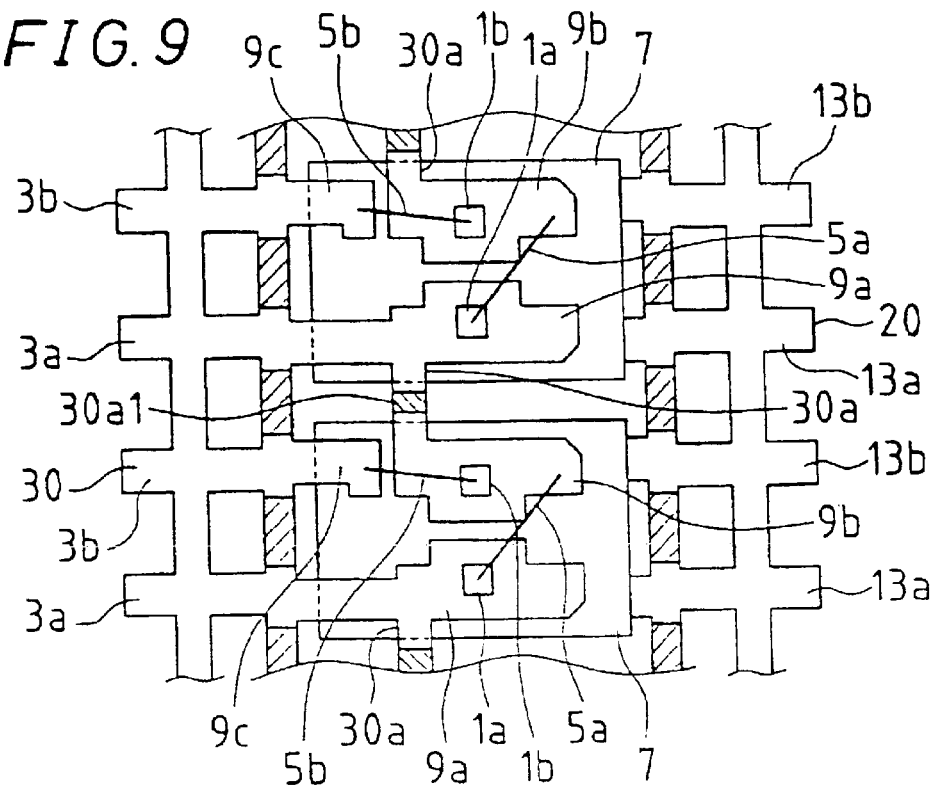
FIG. 9 is a transverse sectional view where primary molding is completed based on still another embodiment of a method of manufacturing a photocoupling device according to the invention.
Figure 10:
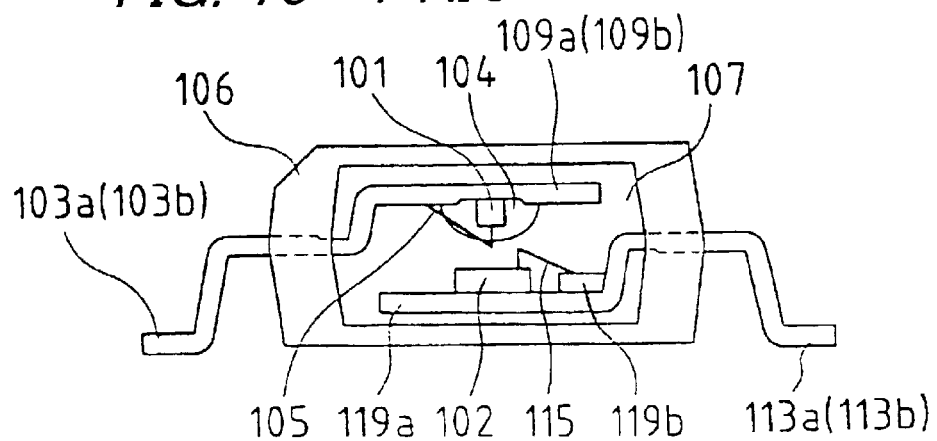
FIG. 10 is a longitudinal sectional view showing an example of a conventional photocoupling device of low input current driving type.
Figure 11:
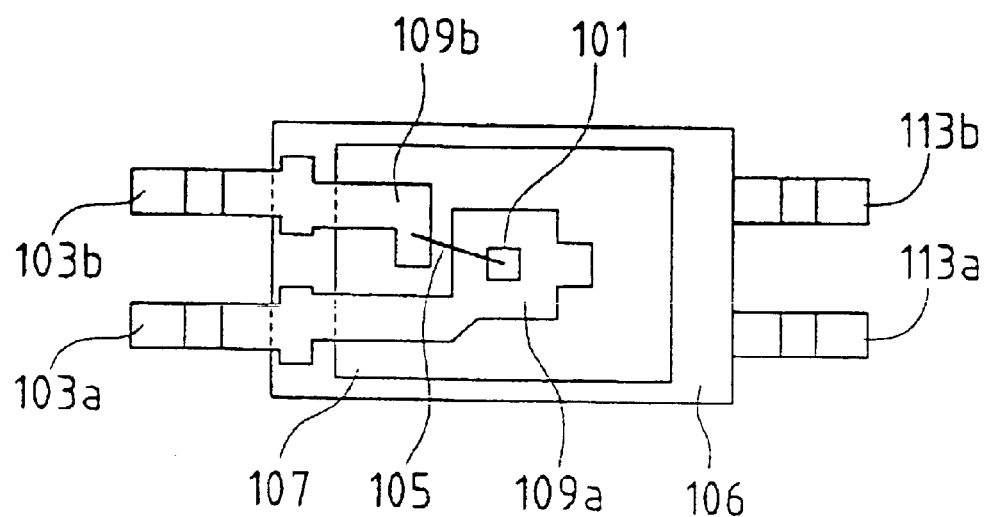
FIG. 11 is a transverse sectional view showing an example of a conventional photocoupling device of low input current driving type.
Figure 12:
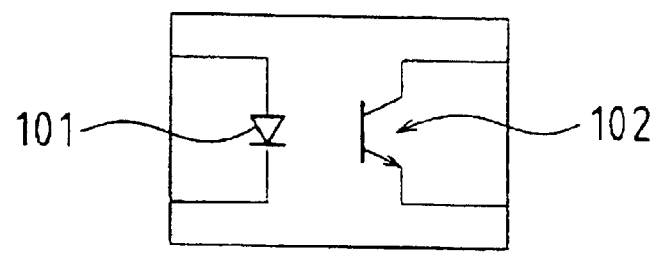
FIG. 12 is an explanatory view showing an example of a connection of the photocoupling device shown in FIGS. 10 and 11.
Figure 13:
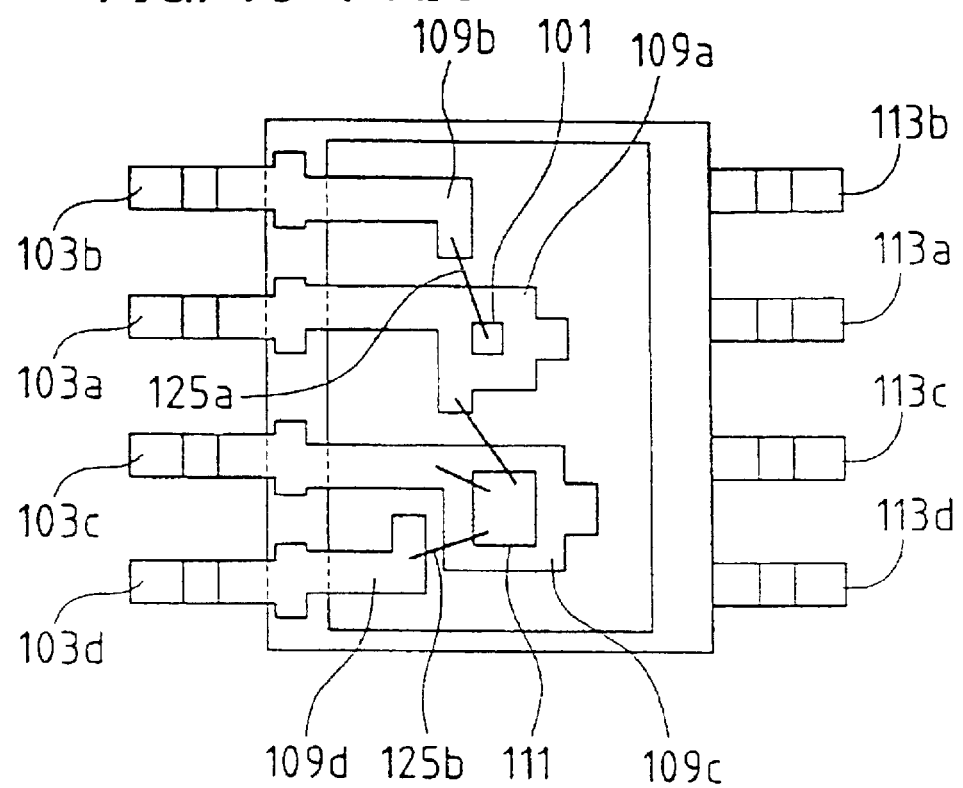
FIG. 13 is a transverse sectional view showing another example of a structure of a conventional photocoupling device of low input current driving type.

FIG. 9 is a transverse sectional view where primary molding is completed based on still another embodiment of a method of manufacturing a photocoupling device according to the invention is completed. In FIG. 9, an input section is mainly shown, whereas an output section is not shown.

The method of manufacturing a photocoupling device of the fourth embodiment differs from that of manufacturing a photocoupling device of the first embodiment, in that the input section is manufactured by using a lead frame 30 in which the dummy header 9b and the header 9a of another channel (a header of a different package) adjacent to the dummy header 9b are connected to each other via a connecting member 30a.

An unnecessary portion 30a1 (a diagonally-shaded portion in FIG. 9) of the connecting member 30a is removed at the time of tie-bar cutting and burr removal after primary or secondary molding. In this case, the tip end of the connecting member 30a locates between the lead terminals on the input section side and the lead terminals on the output section side. Therefore, in the case where the unnecessary portion 30a1 is removed after secondary molding, the connecting member 30a whose potential becomes the same level as the lead terminals on the input section side is disposed closely to the lead terminals on the output section side. As a result, an insulation performance thereof is affected due to a short creeping distance between the lead terminals on the input section side and the lead terminals on the output section side. Accordingly, it is preferable to remove the unnecessary portion 30a1 of the connecting member 30a at the time of tie-bar cutting and burr removal after primary molding, thereby preventing the tip end of the connecting member 30a from protruding beyond the package.

According to the fourth embodiment, it is possible to obtain the same effects as in the case of the photocoupling device and the method of manufacturing the same in the first embodiment.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A photocoupling device comprising:
    an input section having a plurality of light emitting elements and lead terminals for supplying a drive current to the light emitting elements; and
    an output section having one light receiving element which corresponds to the plurality of light emitting elements, wherein a light receiving face is opposed to light emitting faces of the light emitting elements, and lead terminals for supplying a drive current to the light receiving element,
    wherein light from the plurality of light emitting elements is supplied to the light receiving element,
    wherein the light receiving element receives light emitted from the plurality of the light emitting elements, and
    wherein the plurality of light emitting elements are connected in series via a plurality of headers.

2. The photocoupling device of claim 1, wherein at least one of the plurality of headers is provided with two light emitting elements.

3. The photocoupling device of claim 2, wherein structures of the two light emitting elements are different from each other.

4. The photocoupling device of claim 1, wherein at least one of the plurality of headers is a dummy header.

5. The photocoupling device of claim 4, wherein the dummy header is lead-cut from a lead frame inside a package which covers and protects the light emitting elements and the light receiving element.

6. The photocoupling device of claim 4, wherein the dummy header is lead-cut from a lead frame outside a package which covers and protects the light emitting elements and the light receiving element.

7. A method of manufacturing a photocoupling device comprising the steps of:
    forming an input section having a plurality of light emitting elements and lead terminals for supplying a drive current to the light emitting elements and an output section having a light receiving element opposed to light emitting faces of the light emitting elements and lead terminals for supplying a drive current to the light receiving element;
    connecting the plurality of light emitting elements in series via a plurality of headers, at least one of the plurality of headers being a dummy header; and
    tie-bar cutting and lead cutting the dummy header at the same time.

8. The method of manufacturing a photocoupling device of claim 7, wherein a lead-cut portion of the dummy header is disposed in the vicinity of a tie-bar cut portion.

9. A method of manufacturing a photocoupling device, comprising the steps of:
    forming an input section having a plurality of light emitting elements and lead terminals for supplying a drive current to the light emitting elements and an output section having a light receiving element opposed to light emitting faces of the light emitting elements and lead terminals for supplying a drive current to the light receiving element; and connecting the plurality of light emitting elements in series via a plurality of headers, at least one of the plurality of headers being a dummy header, wherein a lead frame is used in which the dummy header is connected to a header of another channel adjacent to the dummy header via a connecting member.

10. A photocoupling device comprising:

an input section having a plurality of light emitting elements and lead terminals for supplying a drive current to the light emitting elements; and an output section having a light receiving element, wherein a light receiving face is opposed to light emitting faces of the light emitting elements, and lead terminals for supplying a drive current to the light receiving element, wherein the light receiving element receives light from the plurality of light emitting elements, and wherein the plurality of light emitting elements are connected in series and wherein the path of light emitted from the light emitting element to the light receiving element is a straight line.

11. A photocoupling device comprising:

an input section having a plurality of light emitting elements and lead terminals for supplying a drive current to the light emitting elements; and an output section having a light receiving element wherein a light receiving face is opposed to light emitting faces of the light emitting elements and lead terminals for supplying a drive current to the light receiving element, wherein the plurality of light emitting elements are connected in series.

* * * * *